United States Patent
Ishimura et al.

(10) Patent No.: US 6,329,700 B1
(45) Date of Patent: Dec. 11, 2001

(54) SEMICONDUCTOR WAFER AND SEMICONDUCTOR DEVICE

(75) Inventors: Youichi Ishimura; Hideki Takahashi, both of Tokyo; Norihisa Asano, Fukuoka, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/253,041

(22) Filed: Feb. 19, 1999

(30) Foreign Application Priority Data

Oct. 13, 1998 (JP) ................................................ 10-290484

(51) Int. Cl.[7] .............................................. H01L 23/544
(52) U.S. Cl. ........................................... 257/620; 257/797
(58) Field of Search ................................. 257/620, 797; 438/462

(56) References Cited

U.S. PATENT DOCUMENTS

| | | | | |
|---|---|---|---|---|
| 5,051,807 | * | 9/1991 | Morozumi | 357/40 |
| 5,462,636 | * | 10/1995 | Chen et al. | 216/17 |
| 5,656,851 | * | 8/1997 | Hamilton et al. | 257/620 |
| 5,696,626 | * | 12/1997 | Hosier et al. | 358/482 |
| 5,903,489 | * | 5/1999 | Hayano | 365/51 |
| 5,949,547 | * | 9/1999 | Tseng et al. | 356/375 |
| 6,023,104 | * | 2/2000 | Koizumi et al. | 257/797 |
| 6,040,632 | * | 3/2000 | Low et al. | 257/784 |
| 6,087,733 | * | 7/2000 | Maxim et al. | 257/797 |

FOREIGN PATENT DOCUMENTS

| | | | |
|---|---|---|---|
| 63-250119 | 10/1988 | (JP) . | |
| 402192143A | * 11/1990 | (JP) | 438/464 |
| 403099453A | * 4/1991 | (JP) | 257/464 |
| 40829347A | * 11/1996 | (JP) | 438/464 |
| 401133703A | * 5/1999 | (JP) | 125/2 |

* cited by examiner

Primary Examiner—Jerome Jackson, Jr.
Assistant Examiner—Lourdes Cruz
(74) Attorney, Agent, or Firm—Oblon, Spivak, McCelland, Maier & Neustadt, P.C.

(57) ABSTRACT

A semiconductor wafer and a semiconductor device with more chips are obtained. The semiconductor wafer includes a plurality of dicing lines (DXa, DXb, DYa, DYb) extending in the lateral direction (X) and in the longitudinal direction (Y) with an interval (L1) therebetween, and a semiconductor element forming region (CR1) with a semiconductor element, sectioned by the dicing lines (DXa, DXb, DYa, DYb). The dicing lines both in the lateral direction (X) and in the longitudinal direction (Y) have alternate widths (La, Lb), one of which (Lb) is larger than the other (La).

7 Claims, 8 Drawing Sheets

US 6,329,700 B1

SEMICONDUCTOR WAFER AND SEMICONDUCTOR DEVICE

BACKGROUND OF THE INVENTION

1. Field of the Invention

The present invention relates to a semiconductor wafer having dicing lines, and a semiconductor device obtained from the wafer.

2. Description of the Background Art

In the manufacture of a semiconductor device, an exposure process is performed a plurality of times. In the exposure process requiring high resolution and accuracy, a mask is aligned by a stepper, using an alignment mark for a stepper previously transferred on a semiconductor wafer. On the other hand, in the exposure process requiring little resolution and accuracy, the mask is aligned by a projection aligner (hereinafter referred to as "PJA"), using an alignment mark for a PJA previously transferred on the semiconductor wafer. In this way, using the stepper and the PJA properly brings improvements in cost and throughput. Thus, concurrent use of the stepper and the PJA has been prevalent. Now, we will give a description of the semiconductor wafer.

FIG. 7 shows a conceptual state of a conventional exposure process. In FIG. 7, R3 is a reticle with patterns CR31 of sixteen semiconductor element forming regions; D1 is a region other than the patterns CR31, corresponding to a dicing line D which will be described later; X is a lateral direction of a semiconductor wafer W; and Y is a longitudinal direction perpendicular to the lateral direction X. The number of shots on this semiconductor wafer W is 60.

The alignment mark for PJA requires a region corresponding to one or more reticles R3. In FIG. 7, two regions PM1 and PM2 have the alignment mark for PJA. Those regions are arranged in parallel to a plane portion of the edge of the semiconductor wafer W (facet).

FIG. 8 is a partial enlarged plan view of the semiconductor wafer W finally obtained through the exposure process in FIG. 7 and other processes. In FIG. 8, D is a dicing line extending straight in the lateral direction X or in the longitudinal direction Y in parallel to others; CR3 is a semiconductor element forming region with a semiconductor element, sectioned by the dicing lines D; SM1 and SM2 are alignment marks for a stepper; and TP is a TEG (Test Element Group) pattern.

The alignment marks SM1, SM2 and the TEG pattern TP are scattered over the dicing lines D which are unavailable regions other than the semiconductor element forming regions CR3 on the semiconductor wafer W.

The semiconductor element forming regions CR3 are all in the shape of a square each side of which is L1. That is, there is the same interval of L1 between adjacent dicing lines D (from edge to edge).

Using a dicing device (dicing saw), the semiconductor wafer W is sliced along the dicing lines D to obtain a plurality of chips. The longitudinal size of a chip is shown as L6.

The plurality of chips need to be the same in size. This is because chips of different sizes may not be easily mounted on a lead frame at a later assembly process or they may complicate a program of the dicing device.

Further, a blade of the dicing device needs to pass through the center of the dicing lines D. This is to prevent the blade of the dicing device from passing through the semiconductor element forming regions CR3 due to a mechanical error of the dicing device.

In order to achieve both, i.e., to equalize the chip size and to pass the blade through the center of the dicing lines, the dicing lines D both in the lateral direction X and in the longitudinal direction Y have had the same width Lb as shown in FIG. 8.

The dicing line is further disclosed in Japanese Patent Laid-Open No. P63-250119A in which every dicing line in the lateral direction has the same width and every dicing line in the longitudinal direction has the same width, but the former width is different from the latter.

The dicing lines, however, need to be wide enough to form the alignment marks SM1, SM2 and the TEG pattern TP thereon. As the width of the dicing lines D increases, an area of the unavailable regions other than the semiconductor element forming regions CR3 is increased on the semiconductor wafer W. This reduces the number of semiconductor element forming regions CR3 on the semiconductor wafer W, thereby reducing the number of chips obtained from the single semiconductor wafer W.

SUMMARY OF THE INVENTION

A first aspect of the present invention is directed to a semiconductor wafer comprising: a plurality of first dicing lines extending in a first direction with a first interval therebetween; a plurality of second dicing lines extending in a second direction with a second interval therebetween, the second direction being orthogonal to the first direction; and a semiconductor element forming region with a semiconductor element, sectioned by the first and the second dicing lines. The plurality of first dicing lines have alternate first and second widths, the second width being larger than the first width.

According to a second aspect of the present invention, in the semiconductor wafer of the first aspect, the plurality of second dicing lines have alternate third and fourth widths, the fourth width being larger than the third width.

According to a third aspect of the present invention, in the semiconductor wafer of the first aspect, the plurality of second dicing lines have the same width smaller than the second width.

According to a fourth aspect of the present invention, in the semiconductor wafer of the first aspect, the first interval equals the second interval.

According to a fifth aspect of the present invention, in the semiconductor wafer of the third aspect, the first interval is longer than the second interval.

According to a sixth aspect of the present invention, the semiconductor wafer of the first aspect further comprises: a pattern used for the manufacturing of a semiconductor device, formed on dicing lines of the maximum width out of the first and the second dicing lines.

A seventh aspect of the present invention is directed to a semiconductor device comprising: a chip obtained by slicing a semiconductor wafer along a plurality of first dicing lines and a plurality of second dicing lines. The semiconductor wafer comprises: the plurality of first dicing lines extending in a first direction with a first interval therebetween; the plurality of second dicing lines extending in a second direction with a second interval therebetween, the second direction being orthogonal to the first direction; and a semiconductor element forming region with a semiconductor element, sectioned by the first and the second dicing lines. The first dicing lines have alternate first and second widths, the second width being larger than the first width.

In the first aspect, unlike the technique disclosed in Japanese Patent laid-Open No. P63-250119A, the first dicing lines have the alternate first and second widths, i.e., first width, second width, first width, second width, first width, . . . . This makes it possible both to equalize the chip size and to pass a blade through the center of the dicing lines, thereby increasing the number of chips obtained from a single semiconductor wafer as compared with the conventional technique. Besides, an alignment mark or a TEG pattern can be formed on the dicing lines of the second width.

In the second aspect, the dicing lines in two-dimensional directions have the alternate widths. This increases the number of chips obtained from a single semiconductor wafer, as compared with the conventional technique.

In the third aspect, the width of the plurality of second dicing lines is narrowed. This increases the number of chips obtained from a single semiconductor wafer.

In the fourth aspect, a larger number of semiconductor element forming regions in the shape of a square can be effectively obtained.

In the fifth aspect, a larger number of semiconductor element forming regions in the shape of a rectangle can be effectively obtained.

In the sixth aspect, the semiconductor wafer can have the pattern to be used for the manufacturing of a semiconductor device, on the dicing lines of the maximum width.

In the seventh aspect, it is possible to increase the number of semiconductor devices each having a chip of the same size obtained from a single semiconductor wafer.

Thus, an object of the present invention is to provide a semiconductor wafer and a semiconductor device which can obtain a larger number of chips while equalizing the chip size and passing the blade through the center of the dicing lines.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
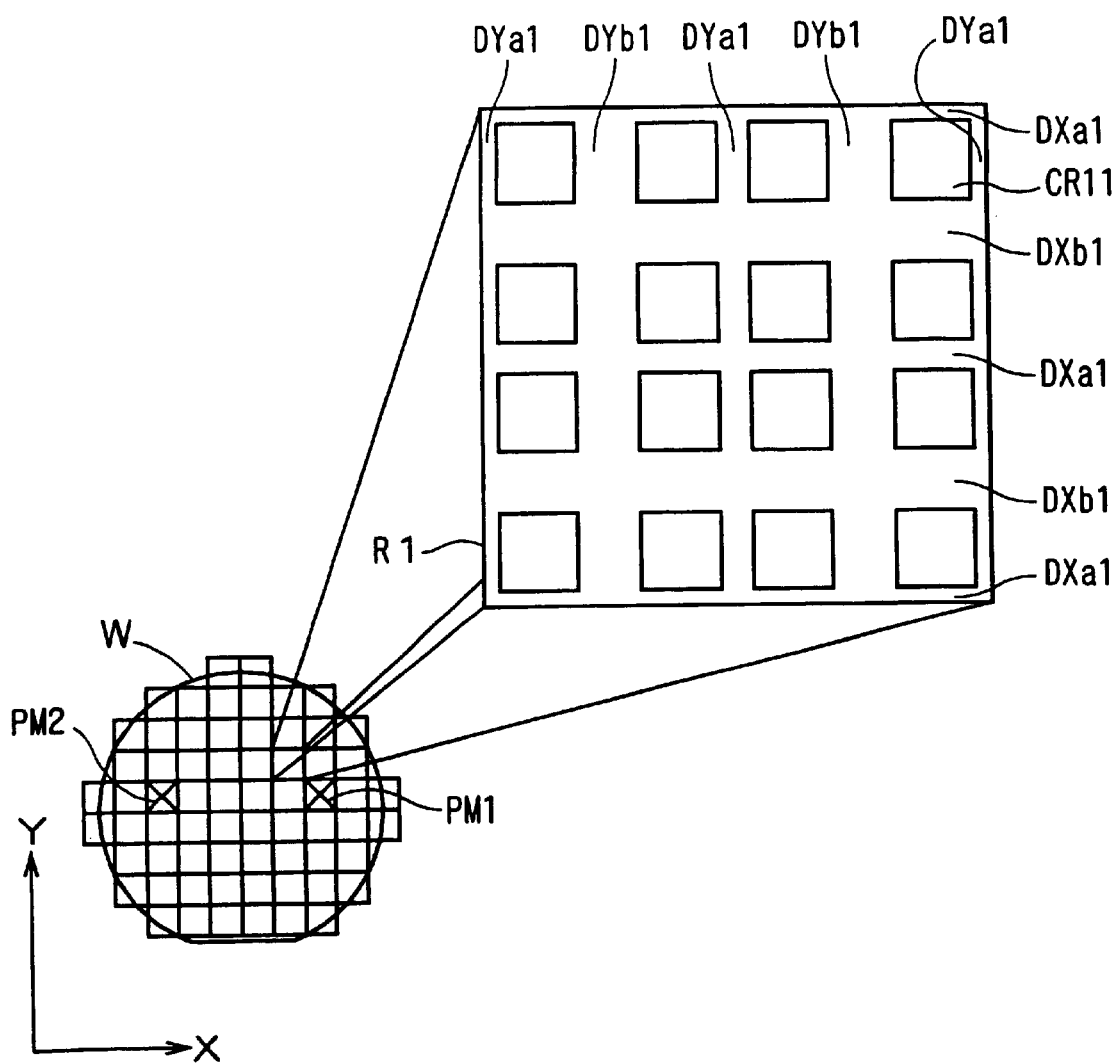
FIG. 1 shows a conceptual state of an exposure process according to a first preferred embodiment of the present invention.

FIG. 1 shows a conceptual state of an exposure process according to a first preferred embodiment of the present invention. In FIG. 1, R1 is a reticle with patterns CR11 of sixteen semiconductor element forming regions; DXa1, DXb1, DYa1, and DYb1 are regions other than the patterns CR11, corresponding to dicing lines DXa, DXb, DYa, DYb which will be described later, respectively; X is a lateral direction of a semiconductor wafer W; and Y is a longitudinal direction perpendicular to the lateral direction X. The number of shots on this semiconductor wafer W is 62.

Regions with an alignment mark for PJA are shown as PM1 and PM2. The alignment mark for PJA is identical with that in the conventional technique.

Figure 2:
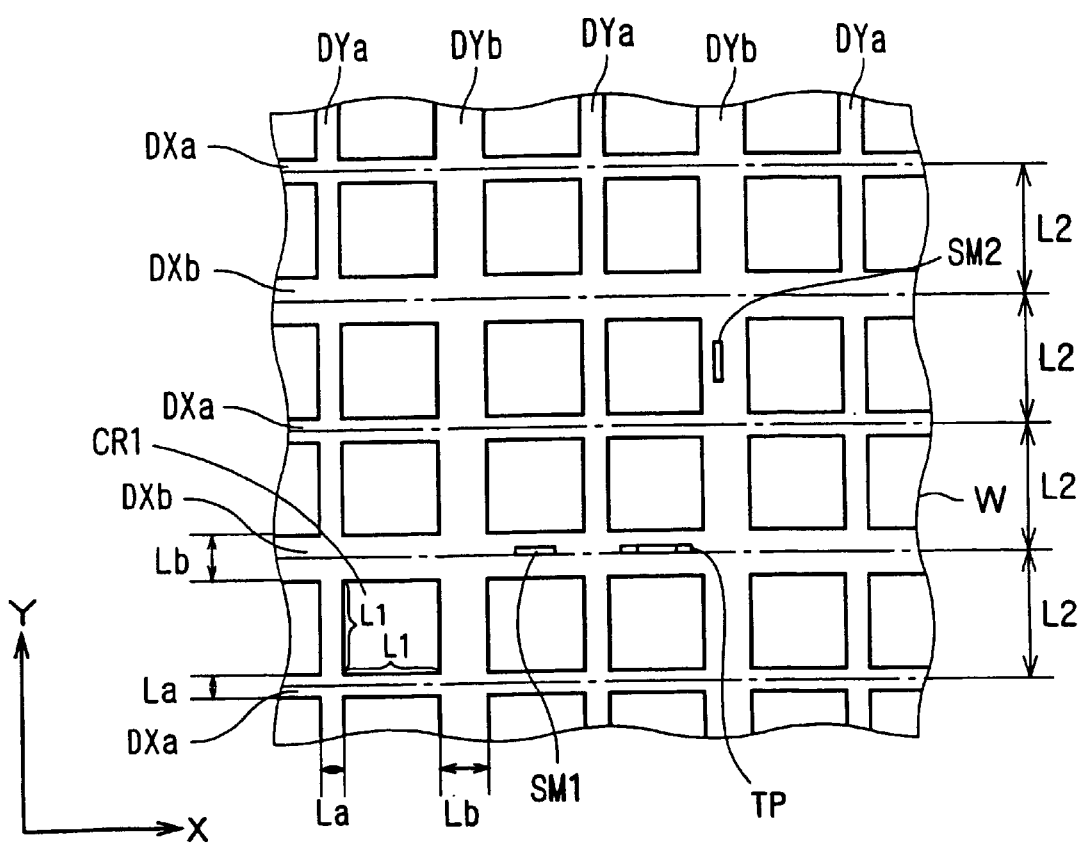
FIG. 2 is a partial enlarged plan view of a semiconductor wafer according to the first preferred embodiment.
Figure 7:
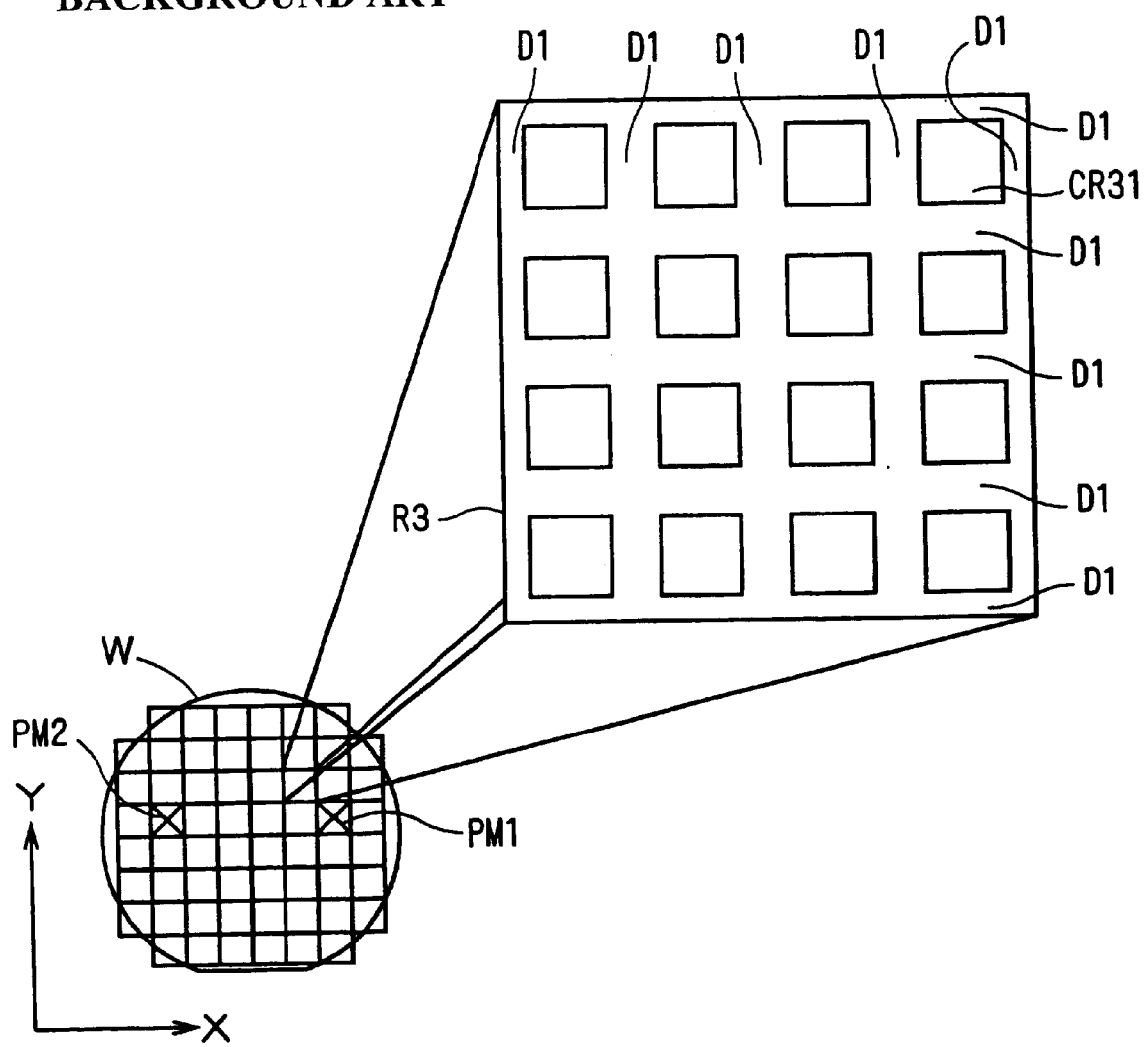
FIG. 7 shows a conceptual state of a conventional exposure process.

FIG. 2 is a partial enlarged plan view of the semiconductor wafer W finally obtained through the exposure process in FIG. 7 and other processes. In FIG. 2, DXa and DXb are dicing lines extending straight in the lateral direction X in parallel with each other (first dicing line); DYa and DYb are dicing lines extending straight in the longitudinal direction Y in parallel with each other (second dicing line); CR1 is a semiconductor element forming region with a semiconductor element, sectioned by the dicing lines DXa, DXb, DYa, DYb; SM1 and SM2 are alignment marks for stepper; and TP is a TEG pattern.

In a single semiconductor element forming region, there may be formed only one semiconductor element such as an IGBT, or an integrated circuit consisting of a plurality of semiconductor elements.

The alignment marks SM1 and SM2 are occasionally used at the exposure process in the manufacture of a semiconductor device, while the TEG pattern TP is used for the evaluation of the resulting semiconductor device.

The dicing lines DXa and DYa have a width of La, and the dicing lines DXb and DYb have a width of Lb, where La<Lb.

The alignment marks SM1, SM2 and the TEG pattern TP are scattered over the dicing lines DXb and DYb in an unavailable region other than the semiconductor element forming regions CR1 on the semiconductor wafer W, and none of them is formed on the dicing lines DXa and DYa. Thus, La only has to be the minimum width required for dicing.

The semiconductor element forming regions CR1 are all in the shape of a square each side of which is L1. That is, there is the same interval of L1 between adjacent dicing lines DXa and DXb (from edge to edge) and between adjacent dicing lines DYa and DYb (from edge to edge).

Using a dicing device, the semiconductor wafer W is sliced along the dicing lines DXa, DXb, DYa, DYb to obtain a plurality of chips. After that, through a well-known assembly process for mounting those chips on a lead frame and other processes, a semiconductor device with the chips obtained from the semiconductor wafer W is obtained.

On the reticle R1 in FIG. 1, external regions DXa1 and DYa1 are about half of internal regions DXa1 and DYa1 and about one fourth of regions DXb1 and DYb1 in width. Further, the semiconductor wafer W is exposed so that the shots adjoin to each other. Thus, external regions DXa1 and DYa1 of one shot adjoin to those of the adjacent shots. Accordingly, as shown in FIG. 2, the dicing lines both in the lateral direction X and in the longitudinal direction Y have alternate widths of La and Lb which is narrower than La, i.e., La, Lb, La, Lb, La, . . . .

Figure 3:
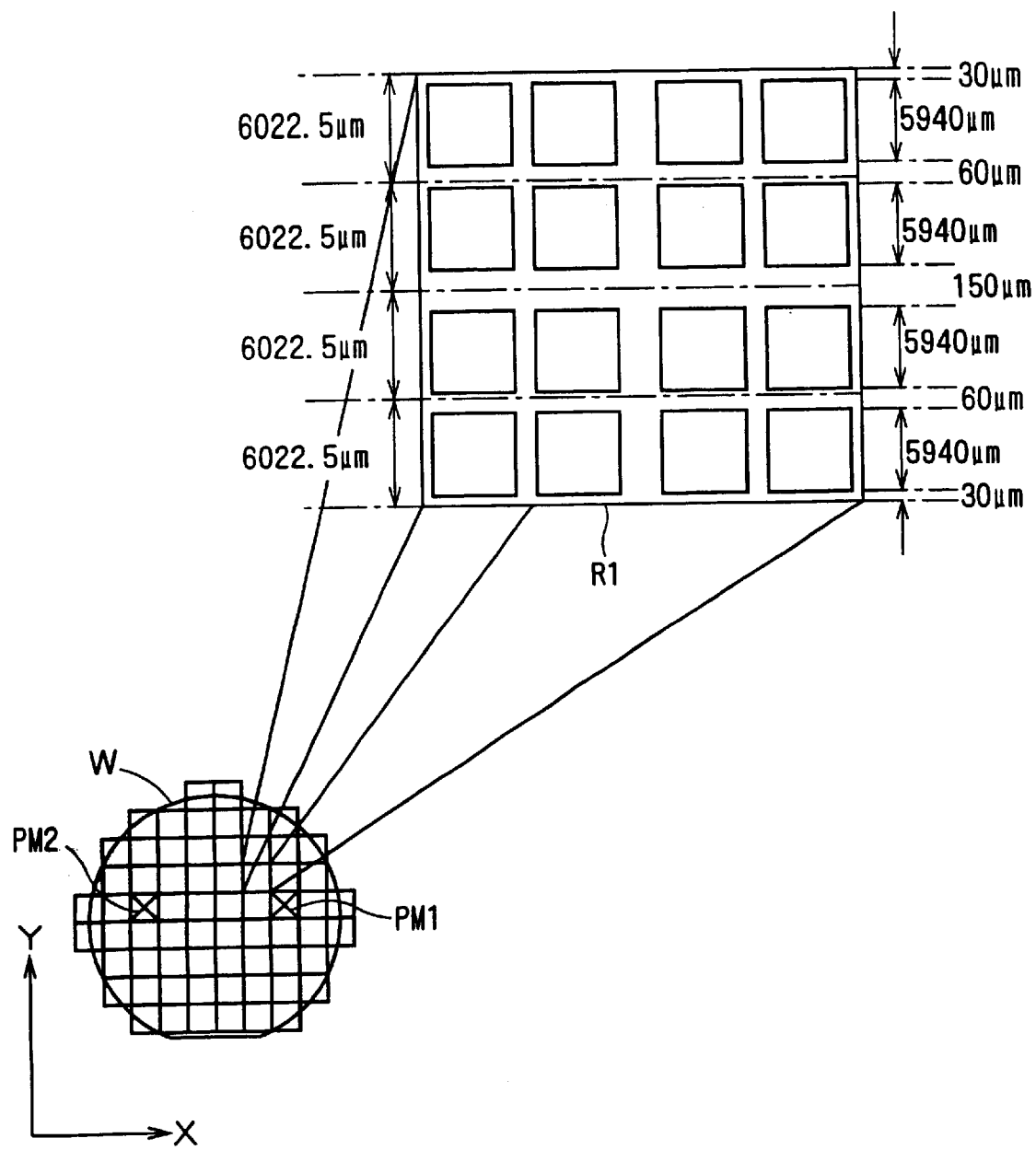
FIGS. 3 and 4 are plan views illustrating the effect of the first preferred embodiment.
Figure 4:
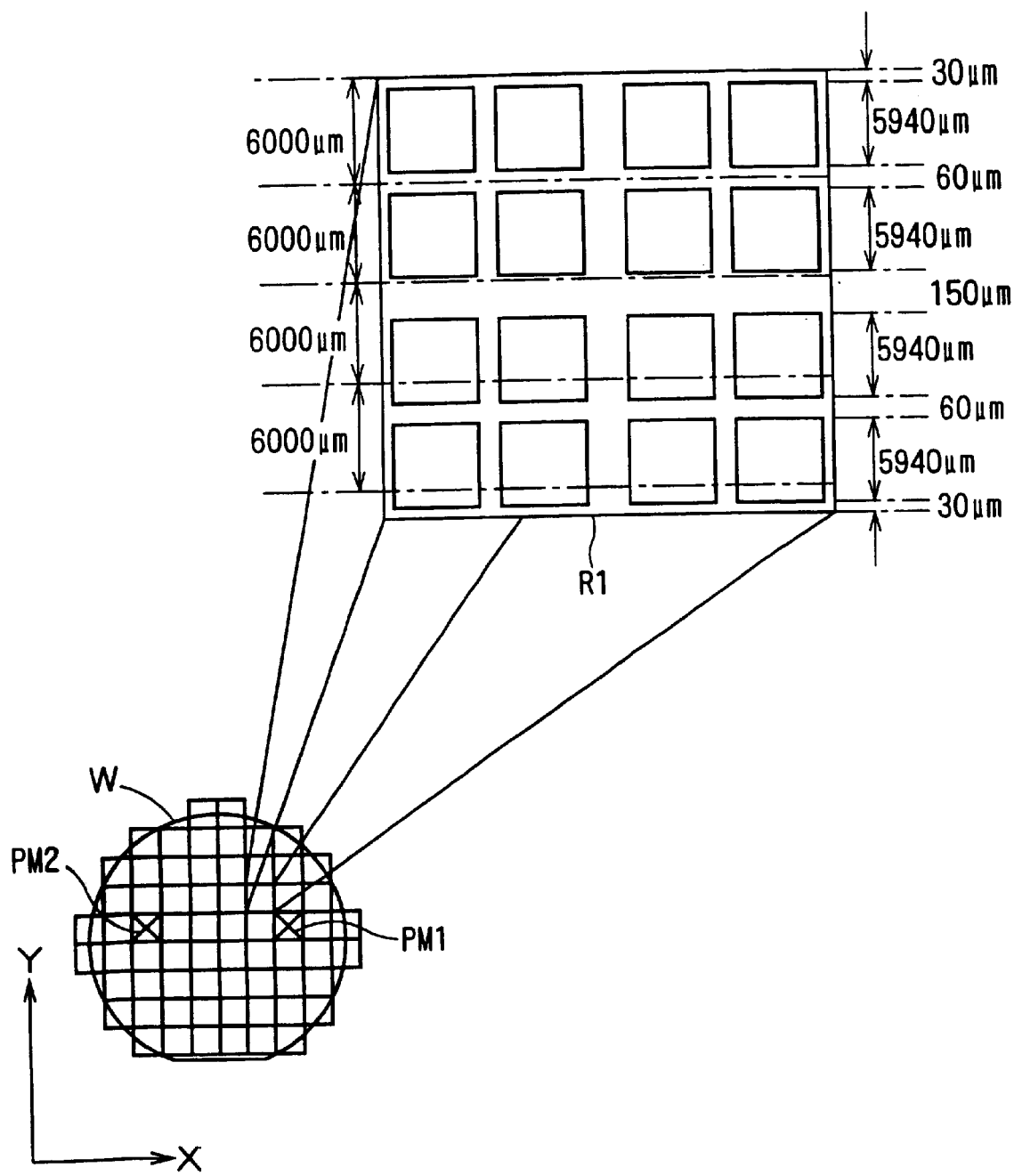

As in the conventional technique, it is necessary to equalize the chip size and to pass the blade of the dicing device through the center of the dicing lines DXa, DXb, DYa, and DYb. On a reticle R1 as shown in FIG. 3, dicing lines do not have alternate widths, i.e., 60 $\mu$m, 60 $\mu$m, 150 $\mu$m, 60 $\mu$m, 60 $\mu$m, . . . . In this case, when the chip size is equalized to be 6022.5 $\mu$m, the blade of the dicing device fails to pass through the center of all the dicing lines. Further, when the chip size is 6000 μm as shown in FIG. 4, the blade of the dicing line will pass through the semiconductor element forming regions.

Therefore, as shown in FIG. 2, the dicing lines both in the lateral direction X and in the longitudinal direction Y have the alternate widths of La and Lb narrower than La, i.e., La, Lb, La, Lb, La, . . . . This makes it possible both to equalize the chip size and to pass the blade through the center of the dicing lines. Besides, as compared with the conventional technique, the width of half of the dicing lines is narrowed from Lb to La, for example, setting L1 at 5940 μm, La at 60 μm, Lb at 150 μm, and L2 at 6045 μm. This reduces the area of the unavailable regions other than the semiconductor element forming regions of CR1 and increases the number of semiconductor element forming regions CR1 on the semiconductor wafer W, thereby increasing the number of chips obtained from the single semiconductor wafer W.

Figure 8:
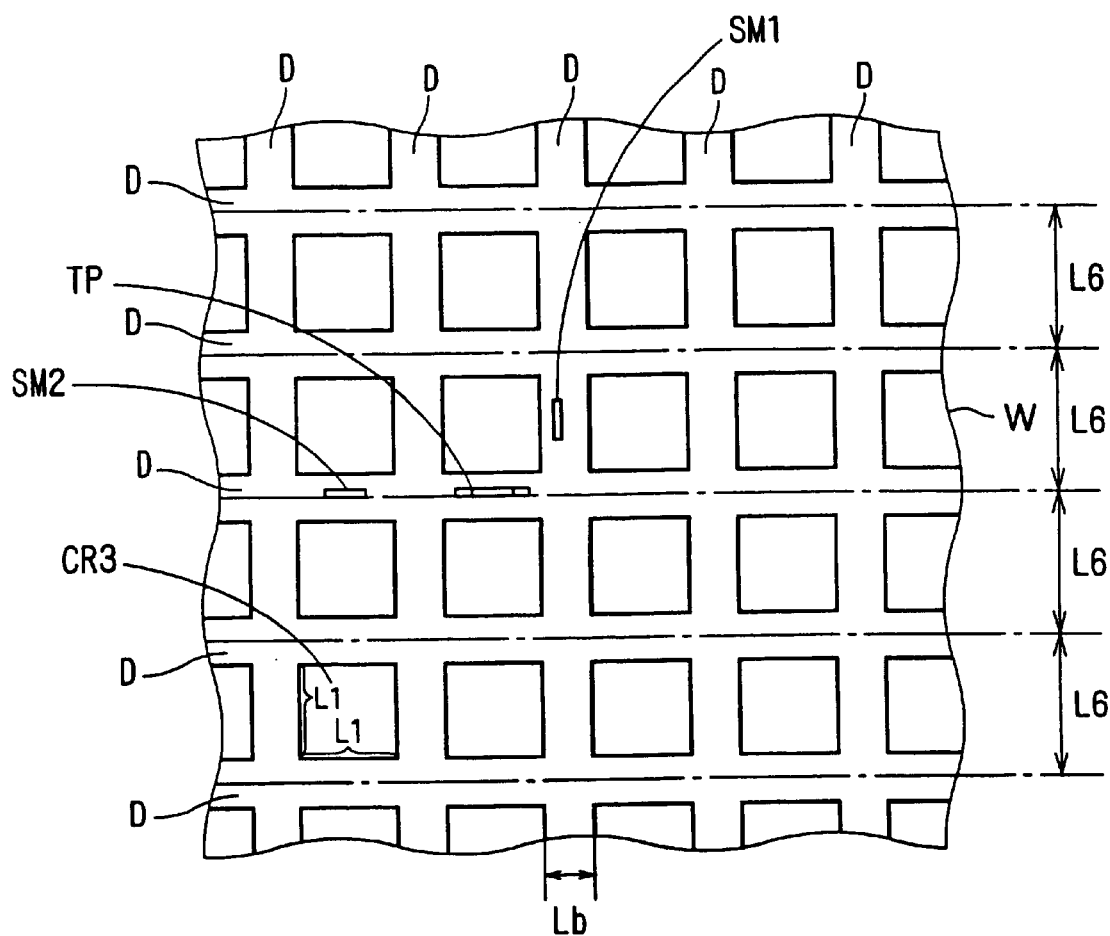
FIG. 8 is a partial enlarged plan view of a conventional semiconductor wafer.

From the conventional semiconductor wafer W with a diameter of 125 mm (effective diameter of 120 mm) and Lb of 150 μm in FIG. 8, for example, there is obtained 778 chips in the shape of a square each side (L6) of which is about 3.55 mm. When the width of half of the dicing lines is narrowed from 150 μm to 60 μm (La) as shown in FIG. 2, there is obtained 828 chips in the shape of a square each side (L2) of which is about 3.50 mm. Therefore, by applying the first preferred embodiment of the present invention, the number of chips obtained from the semiconductor wafer W is increased by 50.

In this fashion, with the dicing line having the alternate widths of La and Lb, i.e., La, Lb, La, Lb, La, . . . , it becomes possible to obtain a larger number of chips from a single semiconductor wafer W, as compared with the conventional technique, while equalizing the chip size and passing the blade through the center of the dicing lines. Besides, the semiconductor wafer W can have the alignment marks SM1, SM2 and the TEG pattern TP to be used for the manufacturing of the semiconductor device, on the dicing lines DXb and DYb of the maximum width Lb.

Further, the dicing lines both in the lateral direction X and in the longitudinal direction Y (i.e., 2-D directions), not in either of them, have the alternate widths. This dramatically increases the number of chips obtained from a single semiconductor wafer W as compared with the conventional technique.

2. Second Preferred Embodiment

Figure 5:
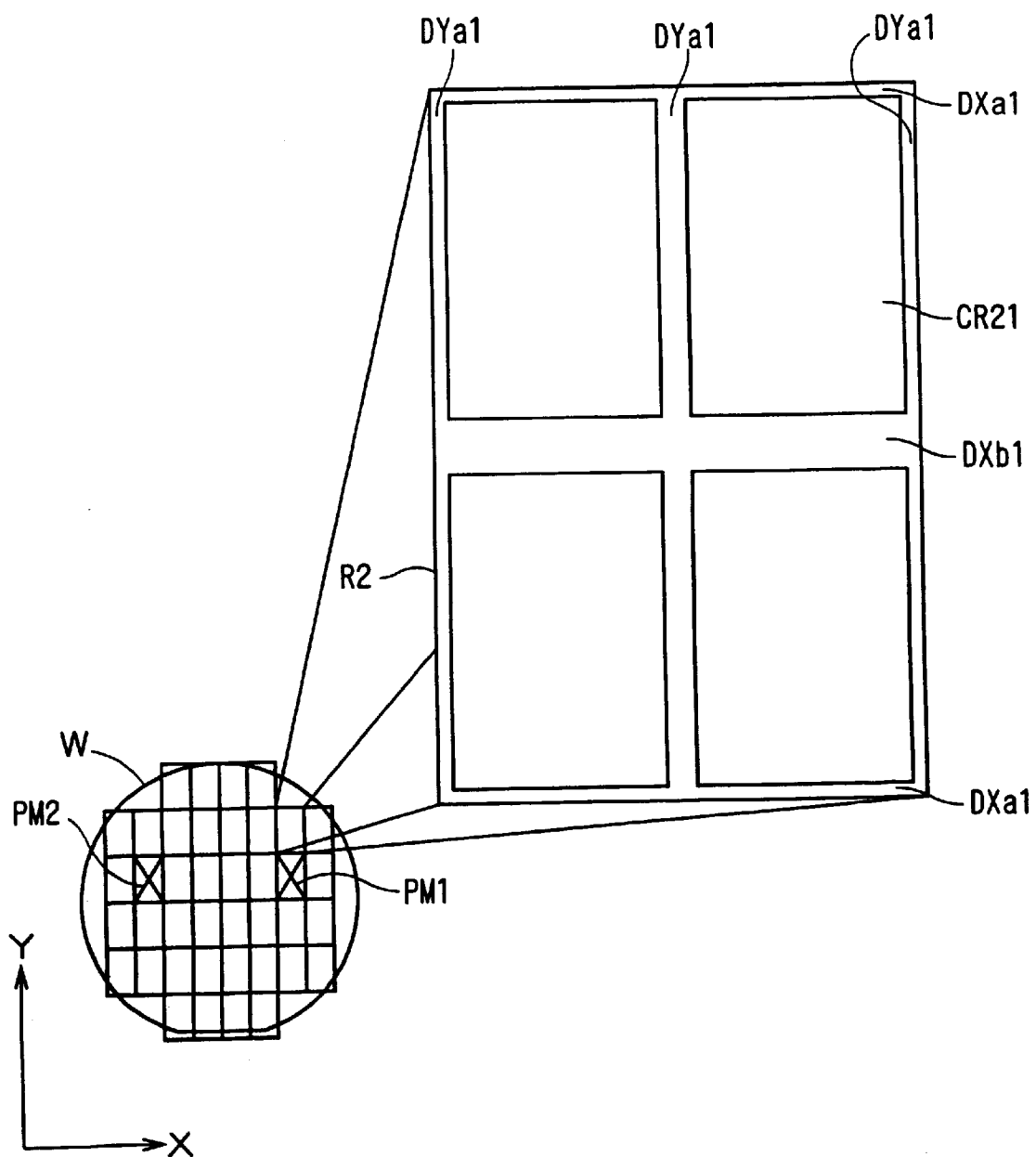
FIG. 5 shows a conceptual state of an exposure process according to a second preferred embodiment of the present invention.

FIG. 5 shows a conceptual state of an exposure process according to a second preferred embodiment of the present invention. In FIG. 5, R2 is a reticle with patterns CR21 of four semiconductor element forming regions. The other reference numerals or characters are identical with those in FIG. 1.

Figure 6:
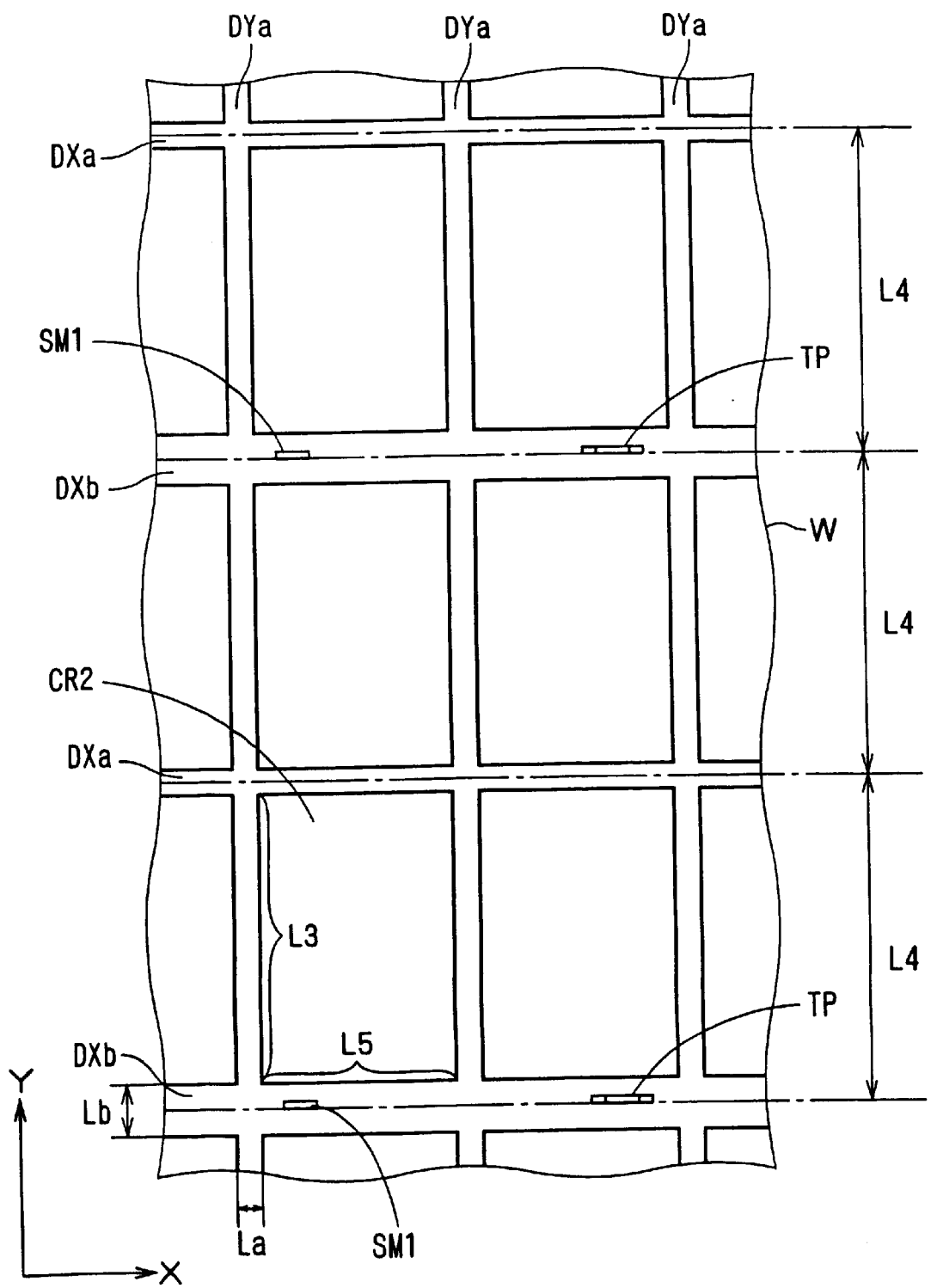
FIG. 6 is a parietal enlarged plan view of a semiconductor wafer according to the second preferred embodiment.

FIG. 6 is a partial enlarged plan view of the semiconductor wafer W finally obtained through the exposure process in FIG. 5 and other processes. FIG. 6 differs from FIG. 2 in the shape of the semiconductor element forming regions CR2 and the dicing lines in the longitudinal direction Y.

In FIG. 6, the dicing lines DYa in the longitudinal direction Y have the same width of La, extending straight in parallel with each other.

The semiconductor element forming regions CR2 are all in the shape of a rectangle the long side of which is L3 and the short side of which is L5. That is, there is the same interval of L3 between adjacent dicing lines DXa and DXb (from edge to edge), and the same interval of L5 between adjacent dicing lines DYa (from edge to edge), where L3>L5.

On the reticle R2 in FIG. 5, an external region DYa1 is about half of an internal region DYa1 in width, and a region DXa1 is about one fourth of a region DXb1 in width. Further, the semiconductor wafer W is exposed so that the shots adjoin to each other. Accordingly, an external region DYa1 of one shot adjoins to that of the adjacent shots, so the dicing lines in the longitudinal direction Y have the same width of La as shown in FIG. 6. Further, a region DXa1 of one shot adjoins to that of the adjacent shots, so the dicing lines in the lateral direction X have alternate widths of La and Lb narrower than La, i.e., La, Lb, La, Lb, La, . . . .

In this fashion, the dicing lines in the lateral direction X have the alternate widths of La and Lb, i.e., La, Lb, La, Lb, La, . . . , while the dicing lines in the longitudinal direction Y have the same width of La narrower than Lb. This makes it possible both to equalize the chip size (L4 in FIG. 6) and to pass the blade through the center of the dicing lines. Besides, a total area of the dicing lines in the longitudinal direction Y is reduced. This increases the number of semiconductor element forming regions CR2 on the semiconductor wafer W, thereby increasing the number of chips obtained from the single semiconductor wafer W.

Further, since the semiconductor element forming regions CR2 are long in the longitudinal direction Y, a total number of dicing lines in the longitudinal direction Y becomes larger than that in the lateral direction X. Accordingly, a total area of the dicing lines can be further reduced if the width of the dicing lines in the longitudinal direction Y, not in the lateral direction X, is narrowed to La.

3. Modification

While the semiconductor wafers in the aforementioned preferred embodiments include both the alignment mark for stepper and the alignment mark for PJA, the present invention is not limited thereto. For example, the semiconductor wafer may include only the alignment mark for stepper.

Further, in FIG. 2, although the dicing lines in both the longitudinal direction Y and the lateral direction X have the alternate widths of La and Lb, i.e., La, Lb, La, Lb, La, . . . , the dicing lines only in one direction may have the alternate widths and the dicing lines in the other direction may have the same width.

When the dicing lines in one direction have the alternate widths and the dicing lines in the other direction have the same width, the width of the dicing lines in the other direction only has to be narrower than Lb. Thus, it may be between La and Lb.

Further, in FIG. 2, although the width of the dicing lines DXa (first width) and the width of the dicing lines DYa (third width) are the same, they may be different from each other. Further, although the width of the dicing lines DXb (second width) and the width of the dicing lines DYb (fourth width) are the same in FIG. 2, they may be different from each other.

Further, the alignment marks SM1, SM2 and the TEG pattern TP to be used for the manufacturing of the semiconductor device may be substituted by other patterns.

While the invention has been described in detail, the foregoing description is in all aspects illustrative and not restrictive. It is understood that numerous other modifications and variations can be devised without departing from the scope of the invention.

We claim:

1. A semiconductor wafer comprising:

a plurality of first dicing lines extending in a first direction with a first interval therebetween;

a plurality of second dicing lines extending in a second direction with a second interval therebetween, said second direction being orthogonal to said first direction; and a semiconductor element forming region with a semiconductor element, sectioned by said first and said second dicing lines, said plurality of first dicing lines having alternate first and second widths, said second width being larger than said first width.

2. The semiconductor wafer of claim 1, wherein said plurality of second dicing lines have alternate third and fourth widths, said fourth width being larger than said third width.

3. The semiconductor wafer of claim 1, wherein said plurality of second dicing lines have the same width smaller than said second width.

4. The semiconductor wafer of claim 1, wherein said first interval equals to said second interval.

5. The semiconductor wafer of claim 3, wherein said first interval is longer than said second interval.

6. The semiconductor wafer of claim 1, further comprising:

a pattern to be used for manufacturing of a semiconductor device, formed on dicing lines of a maximum width out of said first and second dicing lines.

7. A semiconductor device comprising:

a chip obtained by slicing a semiconductor wafer along a plurality of first dicing lines and a plurality of second dicing lines, said semiconductor wafer comprising:

said plurality of first dicing lines extending in a first direction with a first interval therebetween;

said plurality of second dicing lines extending in a second direction with a second interval therebetween, said second direction being orthogonal to said first direction; and a semiconductor element forming region with a semiconductor element, sectioned by said first and said second dicing lines, wherein said first dicing lines have alternate first and second widths, said second width being larger than said first width.

* * * * *